United States Patent [19]
Litwin et al.

[11] Patent Number: 6,043,555
[45] Date of Patent: Mar. 28, 2000

[54] BIPOLAR SILICON-ON-INSULATOR TRANSISTOR WITH INCREASED BREAKDOWN VOLTAGE

[75] Inventors: Andrej Litwin, Danderyd; Torkel Arnborg, Stockholm, both of Sweden

[73] Assignee: Telefonaktiebolget LM Ericsson, Stockholm, Sweden

[21] Appl. No.: 08/948,738

[22] Filed: Oct. 10, 1997

Related U.S. Application Data

[63] Continuation of application No. PCT/SE96/00458, Apr. 9, 1996.

[30]      Foreign Application Priority Data

Apr. 13, 1995 [SE] Sweden ................................. 9501385

[51] Int. Cl.⁷ ........................... H01L 29/00; H01L 27/082
[52] U.S. Cl. ........................... 257/592; 257/526; 257/560; 257/565
[58] Field of Search ................................... 257/526, 592, 257/560, 565; 438/311, 355

[56]            References Cited

U.S. PATENT DOCUMENTS

| | | | |
|---|---|---|---|
| 4,233,618 | 11/1980 | Genesi . | |
| 4,345,163 | 8/1982 | Davis et al. ............................. | 257/526 |
| 4,766,482 | 8/1988 | Smeltzer et al. . | |
| 4,843,448 | 6/1989 | Garcia et al. . | |
| 4,902,633 | 2/1990 | Cambou . | |
| 5,083,180 | 1/1992 | Miura et al. ............................. | 257/592 |
| 5,237,193 | 8/1993 | Williams et al. . | |
| 5,512,774 | 4/1996 | Nakagawa et al. ...................... | 257/501 |
| 5,659,190 | 8/1997 | Litwin ..................................... | 257/273 |

FOREIGN PATENT DOCUMENTS 311 419   4/1989   European Pat. Off. .

OTHER PUBLICATIONS

T. Arnborg et al., "Analysis of New High–Voltage Bipolar Silicon–on–Insulator Transistor with Fully Depleted Collector," IEEE Transctions on Electron Devices, vol. 42, No. 1, pp. 172–177 (Jan. 1995).

Primary Examiner—Tom Thomas
Assistant Examiner—Ori Nadav
Attorney, Agent, or Firm—Burns, Doane, Swecker & Mathis, L.L.P.

[57]            ABSTRACT

In a bipolar silicon-on-insulator transistor having a substrate having a major surface, an oxide layer on the major surface, a silicon layer of a first conductivity type on the oxide layer, a base region of a second conductivity type extending into the silicon layer, an emitter region of the first conductivity type extending into the base region, and a collector region of the first conductivity type extending into the silicon layer at a lateral distance from the base region, a plug region of the second conductivity type extends into the silicon layer up to the oxide layer on the opposite side of said emitter region relative to the collector region, a portion of the plug region extends laterally along the surface of the oxide layer under at least part of the emitter region towards the collector region at a distance from the base region, and the plug region is electrically connected to the base region.

4 Claims, 1 Drawing Sheet

BIPOLAR SILICON-ON-INSULATOR TRANSISTOR WITH INCREASED BREAKDOWN VOLTAGE

This application is a continuation of International Application No. PCT/SE96/00458, filed Apr. 9, 1996, which designates the United States.

TECHNICAL FIELD

The invention relates to a bipolar silicon-on-insulator transistor comprising a substrate having a major surface, an oxide layer on said major surface, a silicon layer of a first conductivity type on said oxide layer, a base region of a second conductivity type extending into said silicon layer, an emitter region of said first conductivity type extending into said base region, and a collector region of said first conductivity type extending into said silicon layer at a lateral distance from said base region.

BACKGROUND

Such a transistor is known e.g. from the paper "Analysis of New High-Voltage Bipolar Silicon-on-Insulator Transistor with Fully Depleted Collector" by Torkel Arnborg and Andrej Litwin in IEEE Transactions on Electron Devices, Vol. 42, No. 1, Jan. 1995.

In the known transistor, the breakdown voltage drops very sharply while increasing the substrate voltage in comparison to the emitter voltage for npn transistors and the opposite for pnp transistors. That is due to the fact that an accumulation layer is created under the emitter of the transistor, which accumulation layer for a certain substrate voltage value makes it impossible to fully deplete the collector under the emitter and lock the potential. The breakdown voltage is thus the same as it would be for a vertical transistor with buried layer and an epitaxial layer over it with similar epitaxial layer thickness and doping as the silicon-on-insulator layer, which breakdown is quite low.

Having the same requirements on the breakdown voltage for both npn and pnp transistors implies that the substrate voltage needs to be close to the middle of the applied operational voltage span. That further lowers the highest possible breakdown voltage for the transistor. Also, a soft collector breakdown or punch through may in some cases start just before the potential lock occurs for increasing collector bias.

SUMMARY

The object of this invention is to prevent this type of breakdown by changing the electric field to reduce or prevent the creation of the accumulation layer on the collector-oxide interface under the emitter.

This is attained in the transistor according to the invention in that a plug region of said second conductivity type extends into said silicon layer up to said oxide layer on the opposite side of said emitter region relative to said collector region, that a portion of said plug region extends laterally along the surface of said oxide layer under at least part of the emitter region towards the collector region at a distance from said base region, and that said plug region is electrically connected to said base region.

Hereby, the voltage operating area will increase before breakdown occurs for the transistor with fully depleted collector.

BRIEF DESCRIPTION OF THE DRAWING

The invention will be described more in detail below with reference to the appended drawing on which

DETAILED DESCRIPTION

Figure 1:
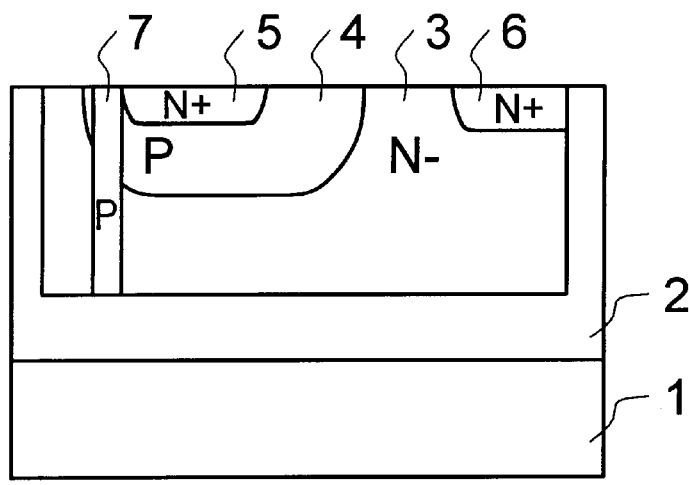
FIG. 1 is a schematic cross-sectional view of a first embodiment of a transistor according to the invention.

FIG. 1 shows a first embodiment of a bipolar silicon-on-insulator (SOI) npn transistor according to the invention. With reverse doping polarities, the invention applies as well to pnp transistors.

The transistor comprises a silicon substrate 1, on a major surface of which an insulating layer 2 of silicon dioxide, is provided.

A silicon layer 3 which is weakly doped with impurities of conductivity type N, is provided on the insulating oxide layer 2.

A base region 4 which is doped with impurities of conductivity type P, extends into the silicon layer 3 from the free surface thereof.

An emitter region 5 which is heavily doped with impurities of conductivity type N, extends into the base region 4 from its free surface.

At a lateral distance from the base region 4, a collector region 6 which is heavily doped with impurities of conductivity type N, extends into the silicon layer 3 from the free surface thereof.

To reduce or prevent the creation of an accumulation layer on the interface between the silicon layer 3 and the oxide layer 2 under the emitter region 5, a plug region 7 which is doped with impurities of conductivity type P, i.e. the same conductivity type as the base region, extends into the silicon layer 3 down to the oxide layer 2 on the opposite side of the emitter region 5 relative to the collector region 6.

In the embodiment shown in FIG. 1, the plug region 7 extends completely through the base region 4 and is in electrical contact with that base region 4.

Figure 2:
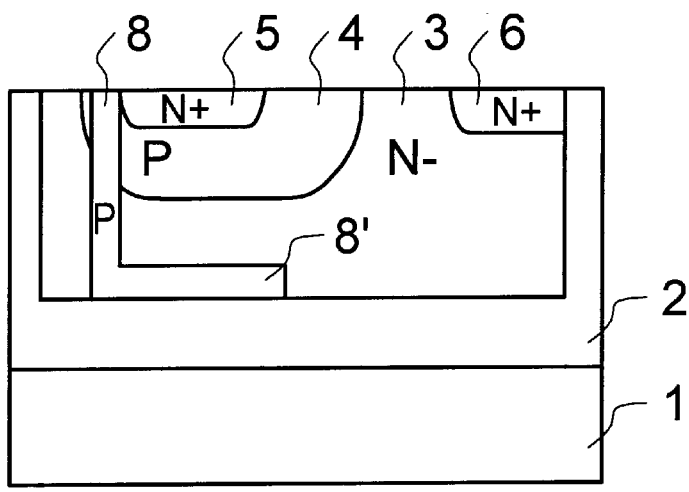
FIG. 2 is a schematic cross-sectional view of a second embodiment of the transistor according to the invention.

FIG. 2 shows a second embodiment of the bipolar SOI transistor according to the invention.

The general design of the transistor according to FIG. 2, is the same as that of the transistor according to FIG. 1, and identical elements are provided with identical reference numerals.

The design of the plug region 8 of the transistor according to FIG. 2, differs however from that of the transistor according to FIG. 1 in that it comprises a portion 8' which extends laterally along the surface of the oxide layer 2 towards the collector region 6 at a distance from the bottom surface of the base region 4.

According to the invention, the plug region portion 8' extends laterally along the surface of the oxide layer 2 under at least part of the emitter region 5. The lateral portion 8' of the plug region 8 should at the most extend laterally up to the edge of the base region 5, facing the collector region 6.

Figure 3:
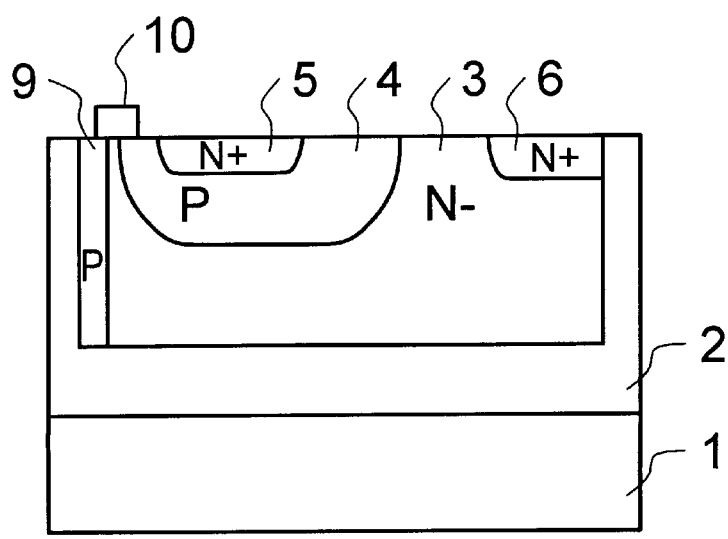
FIG. 3 is a schematic cross-sectional view of a third embodiment of the transistor according to the invention.

FIG. 3 shows a third embodiment of the bipolar SOI transistor according to the invention.

The general design of the transistor according to FIG. 3 does not differ from that of the transistors according to FIGS. 1 and 2, and, consequently, identical elements are provided with the same reference numerals as the elements of the transistors according to FIGS. 1 and 2.

The transistor according to FIG. 3 comprises a plug region 9 which extends down to the oxide layer 2 at a lateral distance from the base region 4.

However, according to the invention, the plug region 9 and the base region 4 are electrically interconnected by an external conductor 10.

The plug region 9 according to FIG. 3, may also be provided with a lateral portion (not shown) similar to the lateral portion 8' of the plug region 8 in FIG. 2.

According to a further embodiment (not shown), the plug region may extend partially through the base region 4 and partially outside the base region 4.

When, in the embodiments according to FIGS. 1, 2 and 3, a voltage is applied between the collector 6 and the base 4, a lateral depletion of the collector region close to the plug region is started, whereby the accumulation layer at the interface between the collector and the oxide layer is reduced.

When a breakdown is caused by base punch through, the lateral field from the base region will increase the space charge layer between the base and the collector and thus delay punch through.

Also, when the breakdown is caused by impact ionization, the field redistribution from the base region will result in a lower field strength and a delay of the avalanche breakthrough.

The delay in breakdown with increasing collector voltage will be sufficient for the later occurring potential lock to protect the transistor.

The plug region 8, 8' according to FIG. 2, is more difficult to manufacture than the plug regions 7 and 9 according to FIGS. 1 and 3, respectively, but all plug region embodiments contribute towards increasing the voltage operating area before breakdown for transistors with fully depleted collector.

What is claimed is:

1. A bipolar silicon-on-insulator transistor, comprising:

a substrate having a major surface;

an oxide layer on the major surface;

a silicon layer of a first conductivity type on the oxide layer, weakly doped with impurities of the first conductivity type;

a base region of a second conductivity type extending into the silicon layer;

an emitter region of the first conductivity type extending into the base region;

a collector region of the first conductivity type extending into the silicon layer at a lateral distance from the base region; and a plug of the second conductivity type for preventing creation of an accumulation layer under the emitter of the transistor that would make it impossible to fully deplete the silicon layer by extending into the silicon layer up to the oxide layer on the opposite side of the emitter region relative to the collector region;

wherein a portion of the plug extends laterally along the surface of the oxide layer under at least part of the emitter region towards the collector region at a distance from the base region, the plug extends, at least partially, through the base region, and the plug is electrically connected to the base region.

2. The transistor of claim 1, wherein the plug extends completely through the base region.

3. The transistor of claim 1, wherein the plug extends at a lateral distance from the base region.

4. The transistor of claim 3, wherein the plug is externally connected to the base region.

* * * * *